United States Patent
Wada et al.

(10) Patent No.: US 7,449,349 B2
(45) Date of Patent: Nov. 11, 2008

(54) PROCESSING SCHEDULE CREATING METHOD, COATING AND DEVELOPING APPARATUS, PATTERN FORMING APPARATUS AND PROCESSING SYSTEM

(75) Inventors: Shigeki Wada, Kumamoto (JP); Akira Miyata, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 502 days.

(21) Appl. No.: 10/555,641

(22) PCT Filed: Apr. 28, 2004

(86) PCT No.: PCT/JP2004/006196
§ 371 (c)(1),
(2), (4) Date: Nov. 4, 2005

(87) PCT Pub. No.: WO2004/100234
PCT Pub. Date: Nov. 18, 2004

(65) Prior Publication Data
US 2007/0004052 A1    Jan. 4, 2007

(30) Foreign Application Priority Data
May 8, 2003    (JP)    ............................. 2003-129860

(51) Int. Cl.
*H01L 21/66* (2006.01)
*B05C 11/00* (2006.01)
(52) U.S. Cl. .............................. 438/14; 438/16; 438/17; 118/698; 118/712; 257/E21.521
(58) Field of Classification Search .................... 438/5, 438/14, 15, 16, 17; 118/698, 712, 715; 257/E21.521, 257/E21.531
See application file for complete search history.

(56) References Cited

U.S. PATENT DOCUMENTS

| | | | | |
|---|---|---|---|---|
| 4,684,863 | A * | 8/1987 | Aldridge et al. | 318/599 |
| 6,387,184 | B1 * | 5/2002 | Gibson et al. | 118/323 |
| 6,507,770 | B2 | 1/2003 | Tateyama et al. | |
| 6,640,148 | B1 * | 10/2003 | Miller et al. | 700/103 |
| 6,725,114 | B1 * | 4/2004 | Jevtic | 700/100 |
| 6,756,243 | B2 * | 6/2004 | Pasadyn et al. | 438/14 |
| 2002/0022377 | A1 * | 2/2002 | Inada et al. | 438/782 |
| 2003/0082837 | A1 * | 5/2003 | Pasadyn et al. | 438/14 |

FOREIGN PATENT DOCUMENTS

| | | |
|---|---|---|
| JP | 6-203042 | 7/1994 |
| JP | 07-283097 | 10/1995 |
| JP | 2002-23823 | 1/2002 |
| JP | 2002-100549 | 4/2002 |

* cited by examiner

Primary Examiner—Scott B. Geyer
Assistant Examiner—Seahvosh J Nikmanesh
(74) Attorney, Agent, or Firm—Oblon, Spivak, McClelland, Maier & Neustadt, P.C.

(57) ABSTRACT

A coating and developing apparatus having a plurality of cassettes includes at least a step of acquiring, for each of all wafers retained in the cassettes, wafer attribute information associated with a cassette retaining that wafer and a process recipe, a step of acquiring inside-cassette information associated with the retained wafer, a step of acquiring information on a process recipe in an exposure apparatus directly from the exposure apparatus, and a step of determining a processing order for the plurality of wafers based on the attribute information, the inside-cassette information, process recipe information of the coating and developing apparatus which the coating and developing apparatus has, and the process recipe information of the exposure apparatus acquired from the exposure apparatus.

28 Claims, 13 Drawing Sheets

| WAFER | CASSETTE | COATING AND DEVELOPING RECIPE | EXPOSURE RECIPE |
|---|---|---|---|
| W1 | CS1 | A | X |
| W2 | CS1 | A | X |
| W3 | CS1 | A | X |
| W4 | CS1 | A | X |
| W5 | CS1 | A | X |
| W6 | CS2 | B | Y |
| W7 | CS2 | B | Z |
| W8 | CS3 | C | X |
| W9 | CS3 | C | X |
| W10 | CS3 | B | Y |
| W11 | CS3 | B | Z |
| W12 | CS3 | B | Y |
| W13 | CS4 | C | X |
| W14 | CS4 | C | X |
| W15 | CS4 | C | X |

FIG.6

| CASSETTE | QUANTITY OF WAFERS | QUANTITY OF COATING AND DEVELOPING RECIPE | QUANTITY OF EXPOSURE RECIPES |
|---|---|---|---|
| CS1 | 5 | 1 | 1 |
| CS2 | 2 | 1 | 2 |
| CS3 | 5 | 2 | 3 |
| CS4 | 3 | 1 | 1 |

FIG.7

|  |  | EXPOSURE START TIME | EXPOSURE END TIME | REQUIRED PROCESS TIME | PROCESS UNIT |
|---|---|---|---|---|---|
| COATING AND DEVELOPING RECIPE | A | ... | ... | 10 | 1 |
|  | B | ... | ... | 12 | 1 |
|  | C | ... | ... | 15 | 1 |
|  |  | ... | ... | ... | ... |
|  |  | ... | ... | ... | ... |
|  |  | ... | ... | ... | ... |
| EXPOSURE RECIPE | X | ... | ... | 5 | 1 |
|  | Y | ... | ... | 3 | 1 |
|  | Z | ... | ... | 8 | 2 |
|  |  | ... | ... | ... | ... |
|  |  | ... | ... | ... | ... |
|  |  | ... | ... | ... | ... |

| WAFER | COATING AND DEVELOPING RECIPE | EXPOSURE RECIPE |
|---|---|---|
| W1 | A | X |
| W2 | A | X |
| W3 | A | X |
| W4 | A | X |
| W5 | A | X |
| W6 | B | Y |
| W7 | B | Z |
| W8 | C | X |
| W9 | C | X |
| W10 | B | Y |
| W11 | B | Z |
| W12 | B | Y |
| W13 | C | X |
| W14 | C | X |
| W15 | C | X |

|  |  | REQUIRED PROCESS TIME | PROCESS UNIT | ... |
|---|---|---|---|---|
| COATING AND DEVELOPING RECIPE | A | 10 | 1 | ... |
|  | B | 12 | 1 | ... |
|  | C | 15 | 1 | ... |
|  |  | ... | ... | ... |
|  |  | ... | ... | ... |
|  |  | ... | ... | ... |
| EXPOSURE RECIPE | X | 5 | 1 | ... |
|  | Y | 3 | 1 | ... |
|  | Z | 8 | 2 | ... |
|  |  | ... | ... | ... |
|  |  | ... | ... | ... |
|  |  | ... | ... | ... |

FIG.14

| CONDITION | SETTING CONDITION |
|---|---|
| COATING AND DEVELOPING PROCESS | 1 |
| EXPOSURE PROCESS | 0 |
| PROCESSING OF OVERALL INLINE APPARATUS | 0 |

1: PRIORITY CONDITION
0: NON-PRIORITY CONDITION

FIG.15

PROCESSING SCHEDULE CREATING METHOD, COATING AND DEVELOPING APPARATUS, PATTERN FORMING APPARATUS AND PROCESSING SYSTEM

TECHNICAL FIELD

The present invention relates to a process schedule creating method which creates a schedule for performing single wafer processing in an inline apparatus which sequentially takes out, from a plurality of containers retaining a plurality of objects to be processed, the objects, and performs an inline process by with a plurality of processing apparatuses.

BACKGROUND ART

In a photolithography process in an electronic device fabrication process for, for example, a semiconductor or the like, a coating and developing apparatus or a unit apparatus, which performs coating and developing of a resist liquid on an object to be processed, such as a wafer, and an exposure apparatus which performs an exposure process on the object coated with the resist liquid are combined to execute an inline process.

In a case where an inline apparatus which performs such an inline process is an apparatus which processes objects to be processed in a single wafer processing manner, a plurality of objects, for example, twenty-five objects are retained as a unit in a cassette as a container, a plurality of such cassettes are prepared, and the objects are taken out from those cassettes one after another to be processed.

For each of the plurality of objects to be processed, a process condition in the inline apparatus (hereinafter called process recipe) is determined. Therefore, there may be case where plural objects to be processed with different process recipes are retained in a single cassette, and a case where objects to be processed with the same process recipe are dispersed over, and retained in, a plurality of cassettes.

When plural objects to be processed with different process recipes are retained in a single cassette, if the objects are processed from an end in a cassette in order cassette by cassette, the process recipes are changed frequently in the inline apparatus. This brings about a problem that it takes a considerable time to process all the objects.

For such a problem, Unexamined Japanese Patent Application KOKAI Publication No. H7-283097 discloses a method of managing objects to be processed in a container as a unit, and scheduling the processing order accordingly.

That is, this method in Unexamined Japanese Patent Application KOKAI Publication No. H7-283097 groups objects to be processed with the same process recipe, and systematically plans a process schedule group by group to optimize the process time for all the objects.

However, the method in Unexamined Japanese Patent Application KOKAI Publication No. H7-283097 performs optimization of the process time for a single processing apparatus, and may bring about the following problem for an inline apparatus constructed by a plurality of processing apparatuses, for example, two processing apparatuses, such as a coating and developing apparatus and an exposure apparatus.

Process recipes for the coating and developing apparatus and the exposure apparatus respective are set for an object to be processed. There is a case where the combination of the process recipe in the coating and developing apparatus and the process recipe in the exposure apparatus differ from each other depending on the object.

In this case, even if objects to be processed with the same process recipe are grouped in consideration of only the process recipe in the coating and developing apparatus, and the order of processing it is scheduled, the processing in the exposure apparatus may not be optimized.

That is, there is a possibility that changing process recipes occurs frequently in the processing in the exposure apparatus. The work of changing process recipes occurs frequently in the processing in the exposure apparatus requires a time for a work of changing a reticle (circuit pattern). This therefore results in that it takes a substantial time to complete processing of all the objects. When processing of the exposure apparatus alone precedes, on the other hand, changing process recipes is likely to occur frequently in the coating and developing apparatus.

DISCLOSURE OF INVENTION

The present invention has been made in view of the circumstances, and an object of the present invention is to provide a process schedule creating method which creates a schedule for efficiently processing all the objects to be processed in a single wafer processing manner in the overall inline apparatus that comprises a plurality of processing apparatuses.

According to the first aspect of the present invention, there is provided a process schedule creating method for creating a schedule at a time an inline apparatus, which has inline-connected first and second processing apparatuses and performs an inline process with those apparatuses, sequentially takes out objects to be processed from a plurality of containers retaining a plurality of objects to be processed, and performs single wafer processing on the objects, the method comprising the steps of causing the first processing apparatus to acquire attribute information on each of all the objects retained in the plurality of containers, associated with a container retaining that object and a process condition; causing the first processing apparatus to acquire inside-container information associated with retained objects for each of the plurality of containers; causing the first processing apparatus to acquire information on a process condition in the second processing apparatus from the second processing apparatus; and causing the first processing apparatus to determine a processing order for the plurality of objects based on the attribute information, the inside-container information, process condition information of the first processing apparatus which the first processing apparatus has, and the process condition information of the second processing apparatus acquired from the second processing apparatus.

According to such a method, for example, the first processing apparatus having a container acquires information on the process condition in the inline-connected second processing apparatus in addition to information relating to processing in the first processing apparatus, so that a most efficient wafer process schedule for the general inline apparatus can be created.

In this case, it is preferable that for each of the objects, the attribute information should include process-condition associated information associated with process conditions under which the processing apparatuses respectively perform processes, and container name information which specifies a container where each object is retained. It is preferable that the inside-container information should include information on a number of objects in the container, and information on a number of process conditions under which the objects in the container are to be processed. Further, it is desirable that the inside-container information should include information on a number of objects in the container, and information on a number of process conditions under which the objects in the container are to be processed.

It is preferable that the step of causing the first processing apparatus to acquire the information on the process condition in the second processing apparatus from the second processing apparatus is carried out as the first processing apparatus should directly communicate with the second processing apparatus inline-connected via a communication path formed in an LAN (Local Area Network).

It is often the case where an LAN has already been provided, and the use of such a facility can reduce the apparatus cost, and direct communication between processing apparatuses this way can reduce the load of intervening apparatus such as a host computer.

According to the second aspect of the invention, there is provided a process schedule creating method for creating a schedule at a time an inline apparatus, which has inline-connected first and second processing apparatuses and performs an inline process with those apparatuses, sequentially takes out objects to be processed from a plurality of containers retaining a plurality of objects to be processed, and performs single wafer processing on the objects, the method comprising the steps of causing control means for controlling a general operation of the inline apparatus to acquire attribute information on each of all the objects, associated with a process condition for that object before the objects are processed by the inline apparatus; causing the control means to acquire process condition information relating to a process condition under which the plurality of objects are processed, from each acquire priority process condition when the objects are processed in each processing apparatus; executing simulation based on the attribute information, the process condition information, and the priority process condition; and determining a processing order for the plurality of objects based on a result of that simulation.

According to such a method, for example, the control means, such as a host computer, which controls the overall inline apparatus acquires information on the processing of objects to be processed for the general inline apparatus before the objects are processed on the inline apparatus, so that an efficient process schedule for the general inline apparatus can be created. It is also possible to create a process schedule with processing in a specific processing apparatus given priority by setting a priority process condition.

In this case, it is preferable that for each of the objects, the attribute information should include process-condition associated information associated with process conditions under which the processing apparatuses respectively perform processes. It is desirable that the process condition information should include information on a time required for a process with the process condition. Further, it is preferable that the priority process condition should be data on either a condition for preceding a process time in each processing apparatus or a condition for preceding a process time in the entire inline apparatus.

According to the third aspect of the invention, there is provided a coating and developing apparatus which is inline-connected to an exposure apparatus, performs single wafer processing on a plurality of substrates sequentially taken out of a plurality of cassettes retaining the substrates, and comprises a substrate attribute acquiring section which acquires attribute information on each of all the substrates retained in the plurality of cassettes, associated with a cassette retaining that substrate and a process condition; a cassette information acquiring section which acquires inside-cassette information associated with retained substrates for each of the plurality of cassettes; a recipe information acquiring section which acquires information on a process condition in the exposure apparatus from the exposure apparatus; and a processing order determining section which determines a processing order for the plurality of substrates based on the attribute information, the inside-cassette information, process condition information of the coating and developing apparatus which the coating and developing apparatus has, and the process condition information of the exposure apparatus acquired from the exposure apparatus.

According to such a coating and developing apparatus, for example, the coating and developing apparatus having a container acquires information on the process condition in the inline-connected exposure apparatus in addition to information relating to processing in the coating and developing apparatus, so that a most efficient substrate process schedule can be created.

According to the fourth aspect of the invention, there is provided a pattern forming apparatus which comprises a coating and developing apparatus and an exposure apparatus inline-connected to each other, and performs single wafer processing on a plurality of substrates sequentially taken out of a plurality of cassettes retaining the substrates, the coating and developing apparatus comprising a substrate attribute acquiring section which acquires attribute information on each of all the substrates retained in the plurality of cassettes, associated with a cassette retaining that substrate and a process condition; a cassette information acquiring section which acquires inside-cassette information associated with retained substrates for each of the plurality of cassettes; a recipe information acquiring section which acquires information on a process condition in the exposure apparatus from the exposure apparatus; and a processing order determining section which determines a processing order for the plurality of substrates based on the attribute information, the inside-cassette information, process condition information of the coating and developing apparatus which the coating and developing apparatus has, and the process condition information of the exposure apparatus acquired from the exposure apparatus.

According to such a pattern forming apparatus, for example, the coating and developing apparatus having a container acquires information on the process condition in the exposure apparatus in addition to information relating to processing in the coating and developing apparatus, so that a most efficient substrate process schedule for the general pattern forming apparatus can be created.

According to the fifth aspect of the invention, there is provided a processing system comprising a pattern forming apparatus which comprises a coating and developing apparatus and an exposure apparatus inline-connected to each other, and performs single wafer processing on a plurality of substrates sequentially taken out of a plurality of cassettes retaining the substrates; control means which controls a general operation of the pattern forming apparatus, and includes a substrate attribute acquiring section which, for each of all the substrates, acquires attribute information associated with that substrate, a recipe information acquiring section which acquires information on process conditions for the plurality of substrates from each of the coating and developing apparatus and the exposure apparatus, and a priority condition acquiring section which acquires a priority process condition when the substrates are processed in each of the coating and developing apparatus and the exposure apparatus; and means for executing simulation based on the attribute information, the process condition information, and the priority process condition in response to an instruction from the control means before the substrates are processed in the pattern forming apparatus, whereby a processing order for the substrates is determined based on a result of that simulation.

According to such a processing system, the control means, such as a host computer, which controls the overall pattern forming apparatus, acquires information on the processing of objects to be processed for the general inline apparatus before the objects are processed on the inline apparatus, so that an efficient process schedule for the general pattern forming apparatus can be created.

BRIEF DESCRIPTION OF DRAWINGS

FIG. 6 is a diagram showing one example of a data table of wafer attribute information;

FIG. 7 is a diagram showing one example of a data table of inside-container information;

FIG. 13 is a diagram showing one example of a data table of wafer attribute information;

FIG. 14 is a diagram showing one example of a data table of process condition information;

FIG. 15 is a diagram showing one example of a data table of priority condition information.

BEST MODE FOR CARRYING OUT THE INVENTION

Embodiments of the present invention will be described below with reference to the accompanying drawings.

First Embodiment

To begin with, a first embodiment of a process schedule creating method according to the present invention will be described based on FIGS. 1 to 9.

Figure 1:
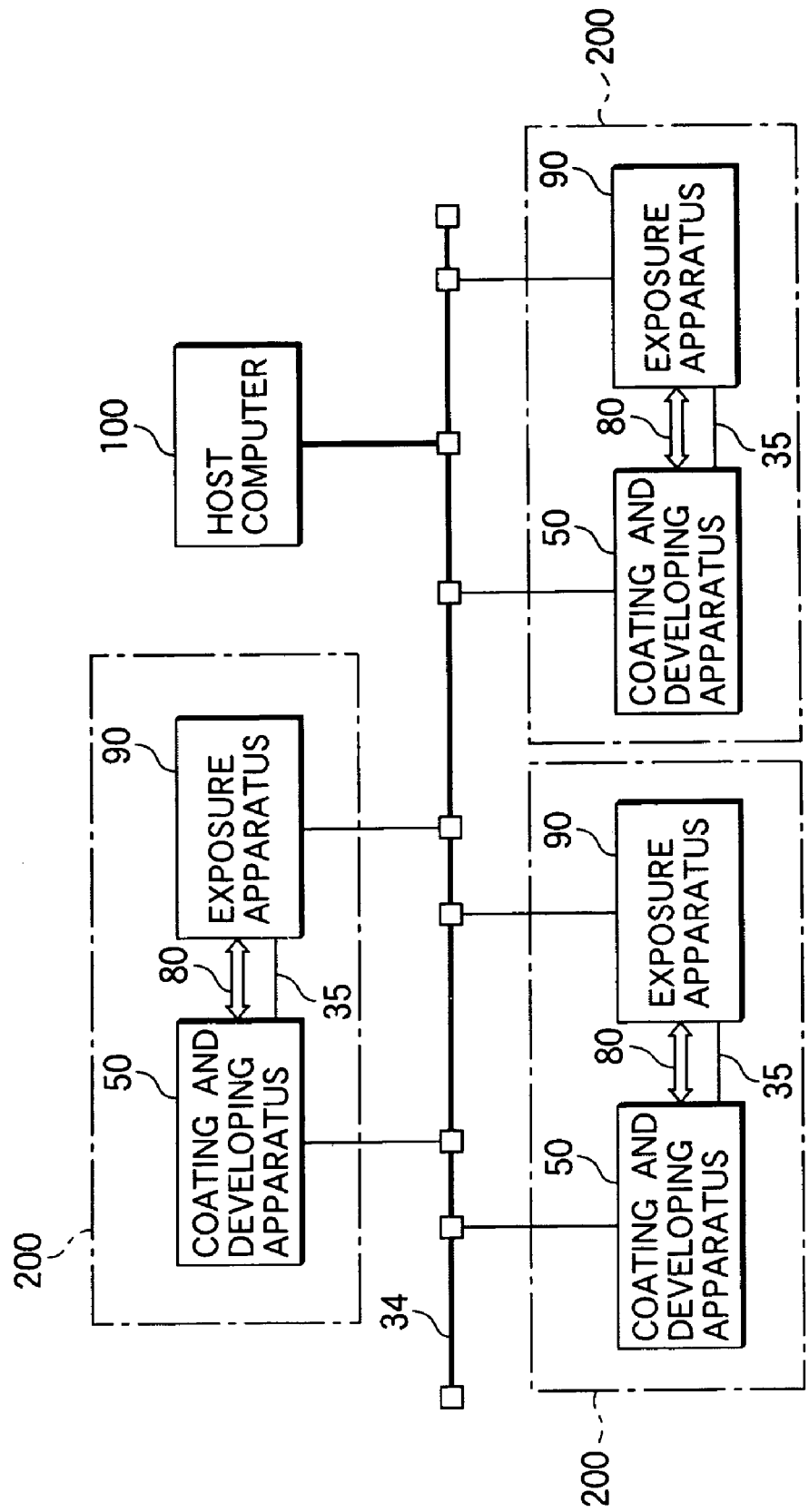
FIG. 1 is a block diagram illustrating the connection relationship between pattern forming apparatuses and a host computer in a processing system which comprises a plurality of pattern forming apparatuses and the host computer, and to which a first embodiment is adapted.

FIG. 1 is a block diagram illustrating the connection relationship between pattern forming systems and a host computer in a processing system comprising a plurality of pattern forming apparatuses (inline apparatuses) and the host computer, which is used in a photolithography process in a fabrication process for an electronic device, such as a semiconductor or a liquid crystal display, and to which a first embodiment is adapted.

As shown in FIG. 1, a pattern forming apparatus 200 has a coating and developing apparatus 50 and an exposure apparatus 90, which are arranged in such a way that transfer of a wafer or a object to be processed is secured by an interface section 80, and are connected to each other by a communication path 35.

A plurality of pattern forming apparatuses 200 (three pattern forming apparatuses shown in FIG. 1) are respectively connected to LAN cables 34 that form an LAN (Local Area Network), such as Ethernet (registered trademark). Specifically, the coating and developing apparatus 50 and the exposure apparatus 90 are connected to the LAN cables 34 to which a host computer 100 is connected.

The host computer 100 performs the operational control of the plural pattern forming apparatuses 200 via the LAN. For example, a process recipe or a process condition information for processing a wafer is designated to each pattern forming apparatus 200, and a process start command is issued thereto.

Figure 2:
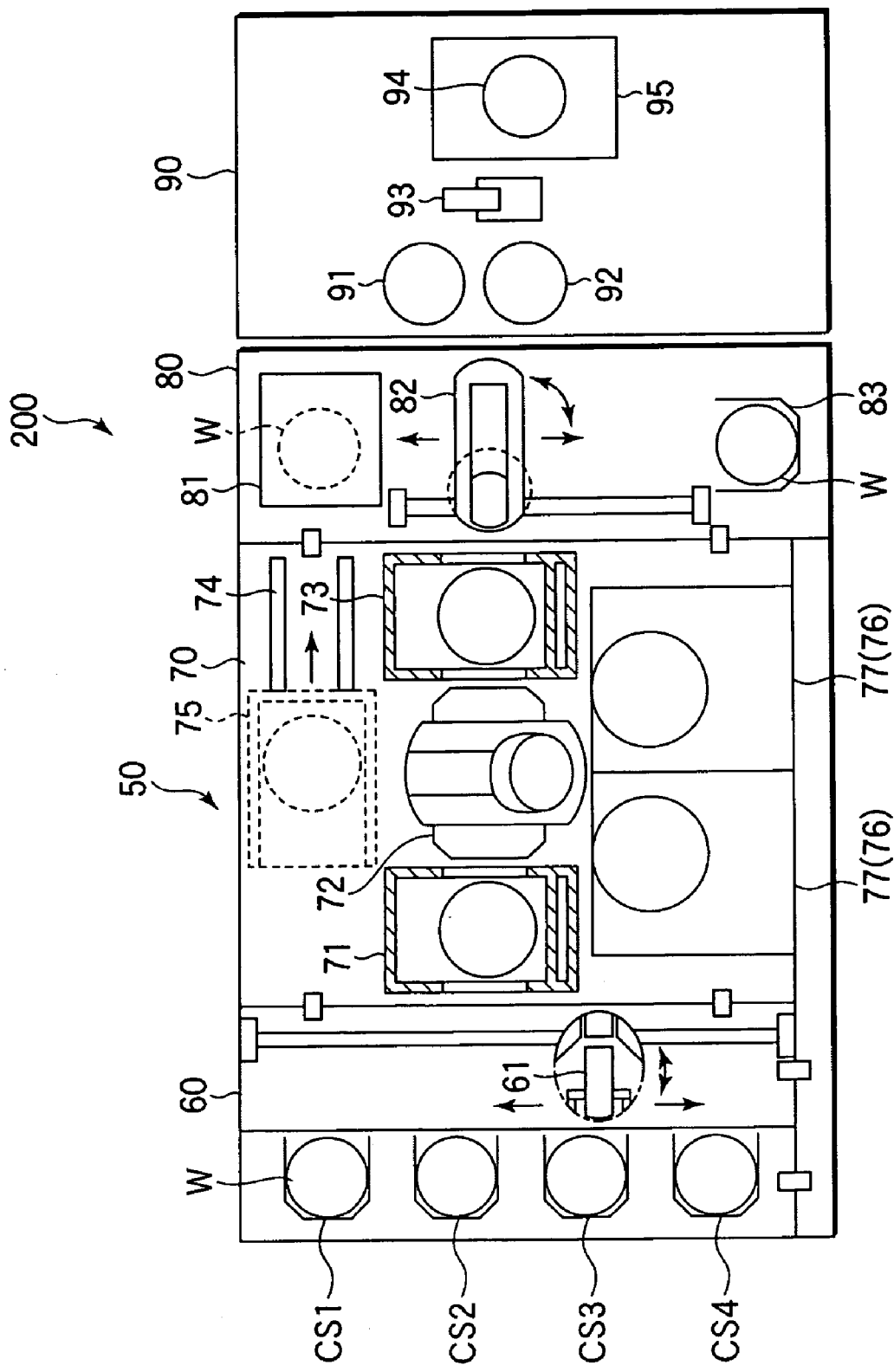
FIG. 2 is a plan view showing the structure of the pattern forming apparatus.

Next, to explain processing on a wafer in each pattern forming apparatus 200, the schematic structure thereof is illustrated in FIG. 2. As shown in FIG. 2, the pattern forming apparatus 200 has the coating and developing apparatus 50 or a first processing apparatus, which performs resist coating on a wafer W and development after exposure, and the exposure apparatus 90 or a second processing apparatus, which exposes the resist coated on the wafer W, and those apparatuses are connected inline.

The coating and developing apparatus 50 comprises a loading/unloading section 60 where a cassette CS retaining a plurality of wafers W or objects to be processed are carried in and out, a coating and developing section 70 which coats a resist on a wafer W, and performs development after exposure, and an interface section 80 which transfers a wafer W between the coating and developing section 70 and the exposure apparatus 90.

The loading/unloading section 60 has a transfer mechanism 61 which transfers a wafer W between the cassette CS and the coating and developing section 70.

The coating and developing section 70 has two coating units 76 which coat the resist on wafers W, two developing units 77 which develop the exposed wafers, and two process unit towers 71 and 73 comprising a plurality of process units, which perform a hydrophobic process, a heating process, a cooling process, and so forth and are placed one on another. Note that a process unit tower 75 indicated by a broken line can be provided, and when the process unit tower 75 is provided, it is movable along a guide rail 74.

One coating unit 76 and one developing unit 77 are stacked in two stages with the coating unit 76 underlying, and the other coating unit 76 and the other developing unit 77 are likewise stacked in two stages.

The coating and developing section 70 has a transfer mechanism 72 to transfer a wafer W, and the coating units 76, the developing units 77, and the process unit towers 71 and 73 are disposed around the transfer mechanism 72. The transfer mechanism 72 transfers a wafer W to and from the coating units 76, the developing units 77 and the individual process units in the process unit towers 71 and 73.

The transfer mechanism 72 is so constructed as to be, for example, elevatable up and down, movable forward and backward, and rotatable about the vertical axis by an unillustrated drive mechanism.

The interface section 80 has a periphery exposure apparatus 81 which exposes only the peripheral portion of a wafer W, a placing portion 83 on which the wafer W is temporarily placed, and a transfer mechanism 82 which transfers the wafer W. The transfer mechanism 82 transfers the wafer W to and from the periphery exposure apparatus 81, and transfers the wafer W between the coating and developing section 70 and the exposure apparatus 90. The placing portion 83 is constructed by stacking hold shelves for, for example, buffering in two stages.

The exposure apparatus 90 comprises a preprocess stage 91 on which a wafer W before exposure is to be placed, a vacuum chamber 95 where exposure is carried out, a light source 94 for exposure, a postprocess stage 92 on which a wafer W after exposure is to be placed, and a transfer arm 93 which transfers a wafer W between each stage 91, 92 and the vacuum chamber 95.

Transfer of a wafer W between the loading/unloading section 60 and the coating and developing section 70, and transfer of a wafer W between the coating and developing section 70 and the interface section 80 are carried out via transfer units respectively provided in the process unit towers 71 and 73.

The inline process for a wafer W in the pattern forming apparatus 200 constructed as described above is carried out as follows.

First, a plurality of wafer cassettes CS where a plurality of wafers W are retained are placed at the loading/unloading section 60 from outside, in which wafers W are taken out sequentially from inside the cassettes CS by the transfer mechanism 61. The wafer W is transferred to the transfer unit of the process unit tower 71. The wafer W placed on the transfer unit is transferred to the hydrophobic process unit in the process unit tower 71 by the transfer mechanism 72, and a hydrophobic process is performed there. Next, the wafer W is transferred to the coating unit 76 where a resist liquid is coated to form a resist film. Thereafter, the wafer W undergoes prebaking in the heating unit in the process unit tower 71, is then transferred to the transfer unit of the process unit tower 73 by the transfer mechanism 72, and is then transferred to the interface section 80 by the transfer mechanism 82.

The wafer W that has been sent to the interface section 80 is temporarily retained on the holding shelf of the placing portion 83 where it is set to the same temperature as the ambient temperature in the exposure apparatus 90, after which it is sent to the exposure apparatus 90.

After exposure by the exposure apparatus 90, the wafer W is returned again to the interface section 80, and only its peripheral portion is exposed by the periphery exposure apparatus 81, after which it is temporarily retained on the placing portion 83 when there is no space in the developing unit 77.

Thereafter, the wafer W is transferred to the transfer unit in the process unit tower 73 by the transfer mechanism 82, is transferred to the heating unit in the process unit tower 71 or 73 where it undergoes post-exposure baking, and it is further cooled by the cooling unit in the process unit tower 71 or 73. After cooling, the wafer W undergoes development in the developing unit 77. Thereafter, it undergoes post baking in the heating unit in the process unit tower 71 or 73, and is cooled by the cooling unit as needed. Thereafter, the wafer W is transferred to the transfer unit in the process unit tower 71 by the transfer mechanism 72, and is returned to the cassette CS at the loading/unloading section 60 by the transfer mechanism 61.

The above-described processing of the wafer W is carried out according to a process recipe which defines the type of a resist liquid to be coated in the coating and developing apparatus 50, and the baking time, etc. (hereinafter, the process recipe in the coating and developing apparatus 50 will be particularly called a coating and developing recipe). This process recipe is separately present in the exposure apparatus 90 in which processing of the wafer W is executed according to a process recipe for an exposure process (hereinafter, the process recipe in the exposure apparatus 90 will be particularly called an exposure recipe).

The types of the coating and developing recipe and the exposure recipe are determined for each wafer W. Information associated with those process recipes is managed for each wafer W as attribute information of the wafer W by the host computer 100.

The attribute information of the wafer W comprises process-condition associated information, and information which specifies that cassette CS where the wafer W is retained, i.e., container name information, and the like. The process-condition associated information is, for example, identification data associated with each process recipe, and the container name information is likely identification data associated with a cassette number or the like. When the cassette CS where the wafer W is retained is placed in the coating and developing apparatus 50, attribute information relating to the wafer W in the cassette CS is input to the coating and developing apparatus 50 via communication from the host computer 100.

Figure 3:
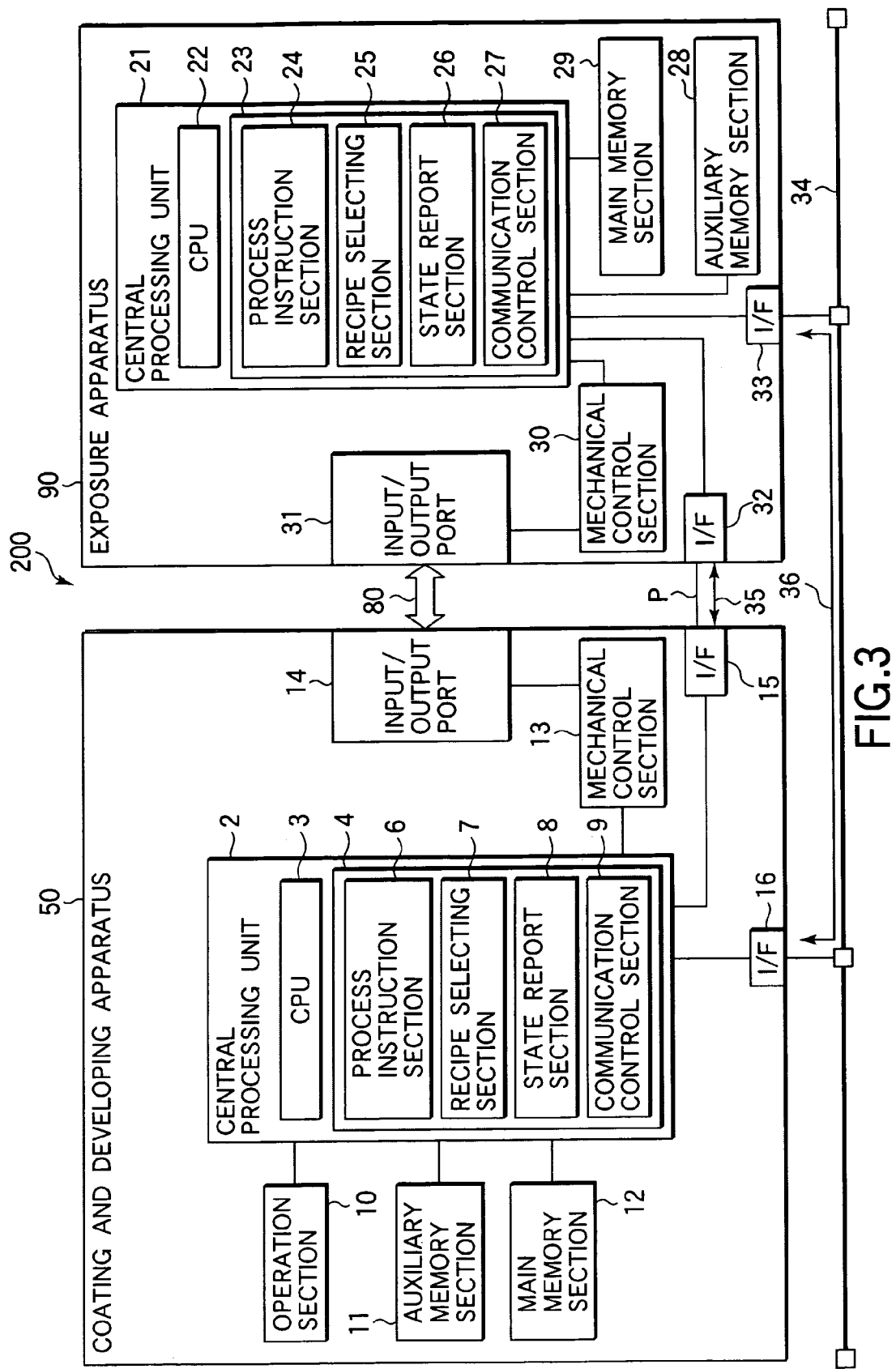
FIG. 3 is a block diagram showing the partial internal structures of a coating and developing apparatus and an exposure apparatus, which constitute the pattern forming apparatus.

FIG. 3 is a block diagram showing the partial internal structures of the coating and developing apparatus 50 and the exposure apparatus 90, which constitute the pattern forming apparatus 200. As shown in FIG. 3, the coating and developing-apparatus 50, which is a processing apparatus, has a central processing unit 2 which performs the general internal control as hardware and is the main portion of the operational control. Connected to this central processing unit 2 are an operation section 10 which is operated by an operator, a non-volatile auxiliary memory section 11, a main memory section 12 which temporarily reads and writes information, a mechanical control section 13 which controls the operations of the mechanical operational portions, and communication interfaces 15 and 16 for executing information communications. An input/output port 14 for carrying a wafer in and out is connected to the mechanical control section 13.

The central processing unit 2 has a CPU 3 and an application specific IC 4, and the IC 4 comprises a process instruction section 6, a recipe selecting section 7, a state report section 8, and a communication control section 9.

The process instruction section 6 has functions, such as outputting an instruction to the coating and developing apparatus 50 based on a process instruction from the host computer 100, e.g., a process start instruction or a wafer lot change instruction.

The recipe selecting section 7 has a function of selecting a corresponding process recipe from a process recipe group stored in the auxiliary memory section 11 based on an identification code sent from the host computer 100. The process recipe group comprises plural types of coating and developing recipes each prepared as program software.

The state report section 8 has a function of reporting information, such as a process schedule, a process status report, a process result report, or failure information, temporarily stored in the main memory section 12, to the host computer 100 and the exposure apparatus 90.

The communication control section 9 has a function of performing communication control with respect to the exposure apparatus 90 and the host computer 100 via the communication interfaces 15 and 16.

Meanwhile, the exposure apparatus 90, which forms an inline apparatus together with the coating and developing apparatus 50, has, as hardware, a central processing unit 21 which is the main portion of the operational control of the exposure apparatus 20. Connected to this central processing unit 21 are a non-volatile auxiliary memory section 28, a main memory section 29 which temporarily reads and writes information, a mechanical control section 30 which controls the operations of the mechanical operational portions in the exposure apparatus 90, and communication interfaces 32 and 33 for executing information communications. An input/output port 31 for carrying a wafer in and out is connected to the mechanical control section 30.

The central processing unit 21 has a CPU 22 and an application specific IC 23, and the IC 23 comprises a process instruction section 24, a recipe selecting section 25, a state report section 26, and a communication control section 27.

The process instruction section 24 has a function of outputting an instruction to the exposure apparatus 90 based on a process instruction from the host computer 100.

The recipe selecting section 25 has a function of selecting a corresponding process recipe from a group of recipes stored in the auxiliary memory section 28 based on an identification code sent from the host computer 100. The process recipe in the exposure apparatus 90 defines, for example, the type of a reticle, the exposure time, and the exposure amount.

The state report section 26 has a function of reporting information, such as a process status report, or failure information, stored in the main memory section 29, to the host computer 100 and the coating and developing apparatus 50.

The communication control section 27 has a function of performing communication control with respect to the coating and developing apparatus 50 and the host computer 100 via the communication interfaces 32 and 33.

The communication interface 15 of the coating and developing apparatus 50 and the communication interface 32 of the exposure apparatus 90 are connected together by a 36-pin parallel cable P, thus forming the communication path 35. As mentioned above, the coating and developing apparatus 50 and the exposure apparatus 90 are connected to the respective LAN cables 34, and are connected via the communication interfaces 16 and 33, respectively, thus forming a communication path 36 on the LAN.

The thus-constructed pattern forming apparatus 200 operates as follows at the start of activation (at the power ON time).

First, when the coating and developing apparatus 50 and the exposure apparatus 90 are both powered on, both system softwares are activated so that the pattern forming apparatus stands by for processing as the inline apparatus.

Thereafter, the coating and developing apparatus 50 performs a work of creating a process schedule having the processing order set for every wafer W to undergo single wafer processing in the pattern forming apparatus 200. This process schedule creating method will be described in detail later.

The created process schedule is sent to the host computer 100 from the main memory section 12 by the state report section 8. The host computer 100 designates a process recipe according to the process schedule, and gives a process start command to the coating and developing apparatus 50 and the exposure apparatus 90.

Then, the coating and developing apparatus 50 and the exposure apparatus 90 respectively select a coating and developing recipe and an exposure recipe according to the process start command, and process the wafer W according to those process recipes.

That is, in the coating and developing apparatus 50, the recipe selecting section 7 selects a corresponding coating and developing recipe from the group of process recipes, stored in the non-volatile auxiliary memory section 11, for each of the wafers W to be taken out according to the process schedule.

The selected coating and developing recipe is temporarily read into the main memory section 12 which can write and read information at a high speed. The process instruction section 6 instructs the mechanical control section 13 to execute a process on a wafer W or an object to be processed according to the coating and developing recipe, read into the main memory section 12, in cooperation with the exposure apparatus 90.

In the exposure apparatus 90, likewise, the recipe selecting section 25 selects a corresponding exposure recipe from the group of process recipes stored in the auxiliary memory section 28 for each wafer W to be taken out according to the process schedule. The selected exposure recipe is temporarily read into the main memory section 29 which can write and read information at a high speed. The process instruction section 24 instructs the mechanical control section 30 to execute an exposure process on a wafer W or an object to be processed according to the exposure recipe in the main memory section 29 in cooperation with the coating and developing apparatus 50.

When a new cassette CS is placed at the loading/unloading section 60 during processing of the wafers W in the coating and developing apparatus 50 and the exposure apparatus 90, the coating and developing apparatus 50 newly creates a process schedule. The renewed process schedule is sent to the host computer 100 from the main memory section 12 by the state report section 8. The host computer 100 gives the process start command to the coating and developing apparatus 50 and the exposure apparatus 90 according to the new process schedule.

The created process schedule is temporarily sent to the host computer 100 this way. The host computer 100 gives the process start command to the coating and developing apparatus 50 and the exposure apparatus 90 according to the new process schedule. However, wafer processing should not necessarily be carried out by the process start command by the host computer 100 this way, but may be carried out according to the process schedule upon judgment by the pattern forming apparatus 200 itself. In this case, the process schedule created by the coating and developing apparatus 50 need not be sent to the host computer 100, and the processing order is checked between the coating and developing apparatus 50 and the exposure apparatus 90 to start the process.

Subsequently, the method of creating the process schedule will be explained based on FIGS. 4 to 9.

Figure 4:
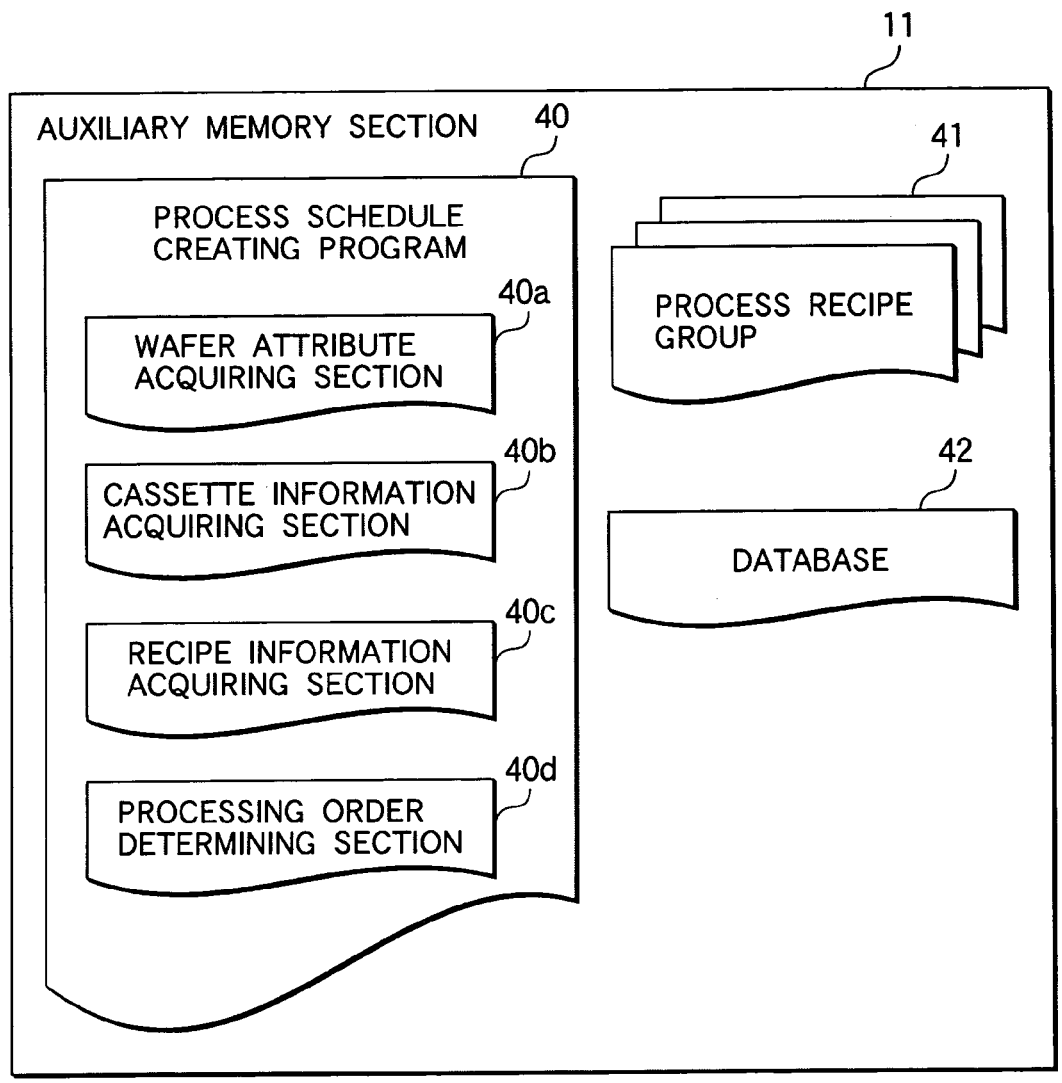
FIG. 4 is a diagram showing partial memory elements of an auxiliary memory section of the coating and developing apparatus.

FIG. 4 shows partial memory elements of the auxiliary memory section 11 of the coating and developing apparatus 50. At least a process recipe group 41 comprising a plurality of process recipes, a process schedule creating program 40, a database 42 storing information on the time needed to process each process recipe in the process recipe group 41 (required process time information) or the like are stored and held in the non-volatile auxiliary memory section 11.

The process schedule creating program 40 comprises a wafer attribute acquiring section 40a, a cassette information acquiring section 40b, a recipe information acquiring section 40c, and a processing order determining section 40d.

The wafer attribute acquiring section 40a has a function of acquiring the attribute information of individual wafers W retained in the cassettes CS (CS1 to CS4) placed in the coating and developing apparatus 50.

Figure 5:
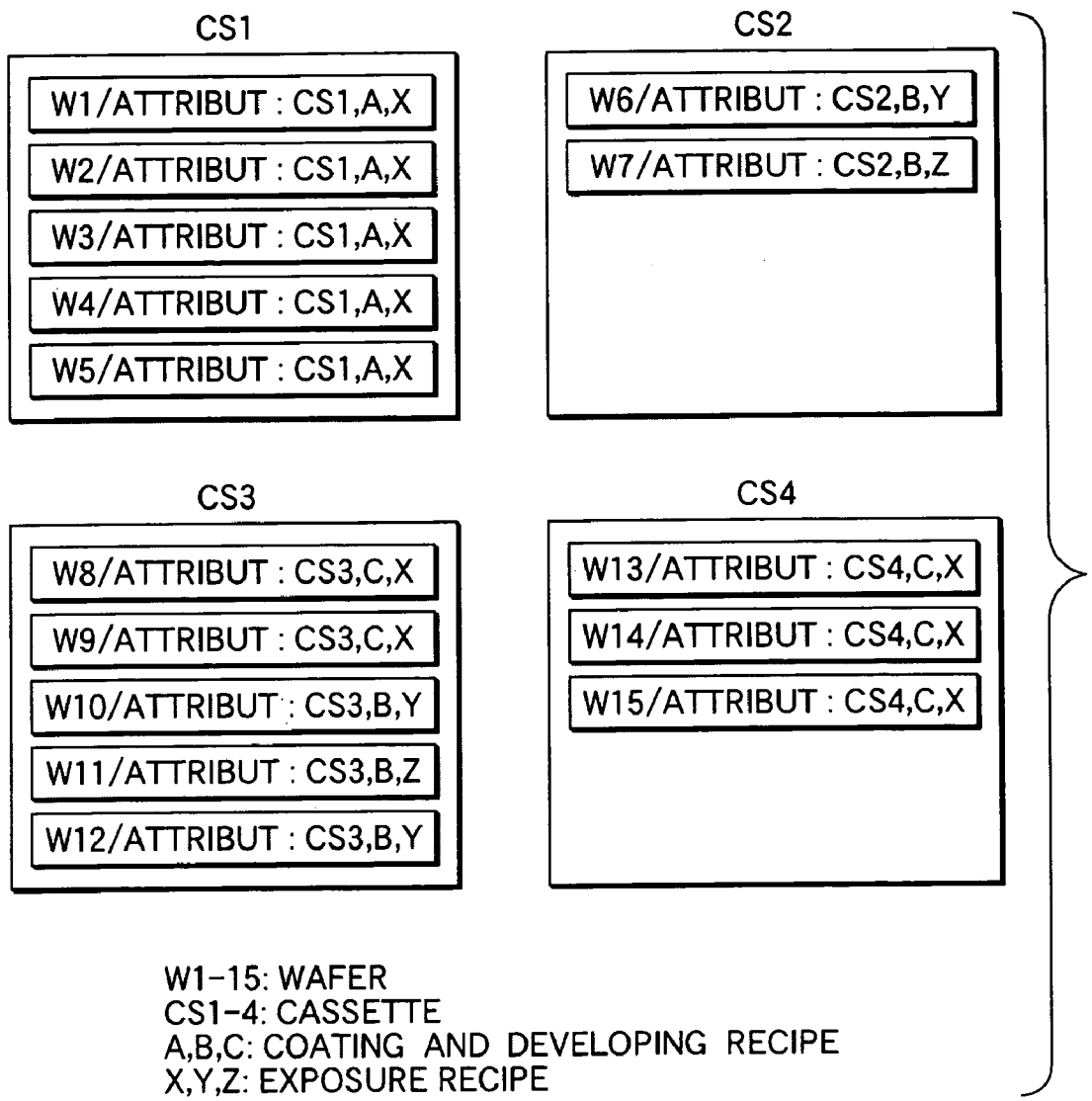
FIG. 5 is a diagram showing one example of attribute information of a wafer retained in a cassette.

As shown in FIG. 5, for example, there are various combinations of the number of the wafers retained in the cassette and the process recipes for the individual wafers W retained in the cassettes CS (CS1 to CS4). The attribute information is associated with the wafer W, and its content comprises information on the name of a container where it is retained (cassette CS name), process recipe information (the coating and developing recipe, exposure recipe), etc. One example of a data table 47 of the attribute information is illustrated in FIG. 6. The wafer attribute acquiring section 40a is so constructed as to acquire the attribute information of each wafer W retained in each cassette CS from the host computer 100 over the LAN, and create the data table 47. At the time the coating and developing apparatus 50 and the exposure apparatus 90 transfer a wafer W therebetween, identification information (W1 to W15) of the wafer W is supplied to the mating apparatus.

The cassette information acquiring section 40b has a function of acquiring information in the cassettes CS (CS1 to CS4) placed in the coating and developing apparatus 50, i.e., inside-container information. The inside-container information includes information on the number of wafers W in the cassette and the number of process recipes by which the wafers W in the cassette are processed, and FIG. 7 shows one example of its data table 48. The cassette information acquiring section 40b acquires the inside-container information over the LAN from the host computer 100, and creates the data table 48.

The recipe information acquiring section 40c acquires information on the time needed to process the process recipe to be used in the coating and developing apparatus 50 (required process time information) or the like, as process recipe information (process condition information), from the database 42. It also directly communicates with the exposure apparatus 90 via the communication path 36 formed on the LAN to acquire process recipe information (process condition information) for the process recipe that is used in the exposure apparatus 90. The process recipe information of the exposure apparatus 90 includes, for example, an exposure start time, required process time information of the exposure recipe, an exposure end time, process unit information of the wafer W, and the like. The recipe information acquiring section 40c creates a data table 49 which is exemplified in FIG. 8 from the acquired information.

The processing order determining section 40d has a function of performing grouping on the same process recipe, arithmetic operations of the required process time and the like by referring to the data tables 47, 48 and 49, and determining the most efficient processing order for every wafer W.

At the time the processing order determining section 40d determines the processing order, management of the PED (Post Exposure Delay) time is taken into account. The PED time management is management to keep the time from the end of an exposure process to the beginning of a heating processing constant when, for example, a chemically amplified resist, is used in the processing in the pattern forming apparatus 200.

In this case, it is preferable that the processing order determining section 40d should determine the processing order in consideration of the exposure start and end times included in the process recipe information of the exposure apparatus 90, the time at which the interface section 80 receives the wafer W from the exposure apparatus 90, and the time at which the heating section in the process unit 71 or 75 receives the wafer W, so that the optimal PED time management can be performed for each wafer W.

To execute the PED time management more accurately, a standby time may be provided in, for example, the transfer of a wafer W by the transfer mechanism 72 to execute standby time control, and the processing order may be determined further in consideration of the standby time.

To execute the PED time management in the aforementioned manner, the coating and developing apparatus 50 should acquire identification information (W1 to W15) of the wafer W and information on the exposure start and end times from the exposure apparatus 90.

At this time, when the clocks (times) of the exposure apparatus 90 and the coating and developing apparatus 50 exactly match with each other, the coating and developing apparatus 50 has only to use the information directly acquired from the exposure apparatus 90 by the recipe information acquiring section 40c or the like.

When the clocks (times) of the exposure apparatus 90 and the coating and developing apparatus 50 do not match with each other, on the other hand, the coating and developing apparatus 50 acquires the information as follows.

First, the coating and developing apparatus 50 receives the identification information (W1 to W15) of the wafer W and the exposure start information from the exposure apparatus 90 at the timing of the start of exposure. Here, the coating and developing apparatus 50 identifies the timing of the start of exposure from the clock (time) of the coating and developing apparatus 50.

At the timing of the end of exposure, the coating and developing apparatus 50 receives the identification information (W1 to W15) of the wafer W and the exposure end information from the exposure apparatus 90. Here, the coating and developing apparatus 50 identifies the timing of the end of exposure from the clock (time) of the coating and developing apparatus 50.

Even when the clocks (times) of the exposure apparatus 90 and the coating and developing apparatus 50 do not exactly match with each other, the coating and developing apparatus 50 can acquire information on the exposure start and end times, and can execute the PED time management.

Figures 8, 9:
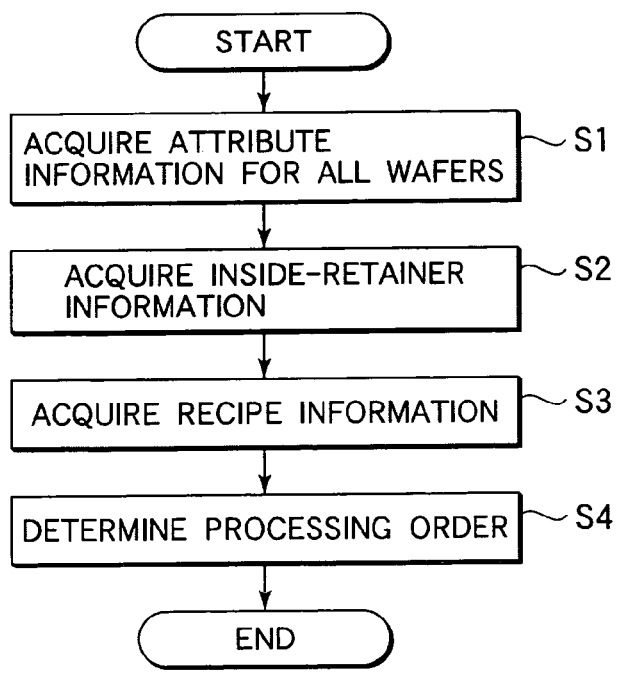
FIG. 8 is a diagram showing one example of a data table of process recipe information.
FIG. 9 is a diagram illustrating the execution flow of a process schedule creating program.

FIG. 9 is a diagram illustrating the execution flow of the process schedule creating program 40 which is executed by the coating and developing apparatus 50.

When the coating and developing apparatus 50 and the exposure apparatus 90 both go to the process standby state after being powered on, the process schedule creating program 40 is activated. Then, the wafer attribute acquiring section 40a acquires the attribute information of all the wafers W in the cassettes CS (CS1 to CS4) from the host computer 100, and creates the data table 47 (step S1).

Next, the cassette information acquiring section 40b acquires the inside-container information of the cassettes CS (CS1 to CS4) from the host computer 100, and creates the data table 48 (step S2).

Then, the recipe information acquiring section 40c acquires the required process time information of the coating and developing recipe to be used from the database 42, issues a command requesting information of an exposure recipe or process recipe information to the exposure apparatus 90, acquires information unique to the exposure apparatus 90, and creates the data table 49 from that information (step S3).

The processing order determining section 40d performs grouping on the same process recipe, arithmetic operations of the required process time and the like by referring to the data tables 47, 48 and 49, and determines the most efficient processing order for every wafer W (step S4).

Note that the processing order of the steps S1 to S3 may be changed or they may be processed in parallel.

According to the first embodiment, in the above-described manner, the coating and developing apparatus 50 in which the cassette CS retaining wafers W is placed acquires information on the process recipes of all the wafers in the cassette (the coating and developing recipe and exposure recipe), and creates a process schedule for processing the wafers most efficiently as the overall inline apparatus. Accordingly, the host computer 100 can execute efficient wafer processing as the inline apparatus by issuing process commands to the coating and developing apparatus 50 and the exposure apparatus 90 according to the process schedule.

Further, as such a process schedule is created in each of plural inline apparatuses and the host computer 100 gives process commands to the individual inline apparatuses according to those process schedules, it is possible for the entire system to execute efficient wafer processing.

While the non-volatile auxiliary memory section 11 in the coating and developing apparatus 50 is a single non-volatile memory section in the first embodiment, it may be divided into plural sections. The method that includes steps executed by the process schedule creating program 40 stored in the non-volatile auxiliary memory section 11 may be realized by hardware. Further, the inline apparatus is not limited to the coating and developing apparatus and the exposure apparatus, but the control method of the invention can be adapted to other apparatuses as long as they are inline apparatuses.

Second Embodiment

Next, the second embodiment of the process schedule creating method of the invention will be described based on FIGS. 10 to 16. The components which overlap those of the first embodiment are denoted by common reference symbols, and their detailed descriptions will be omitted.

Figure 10:
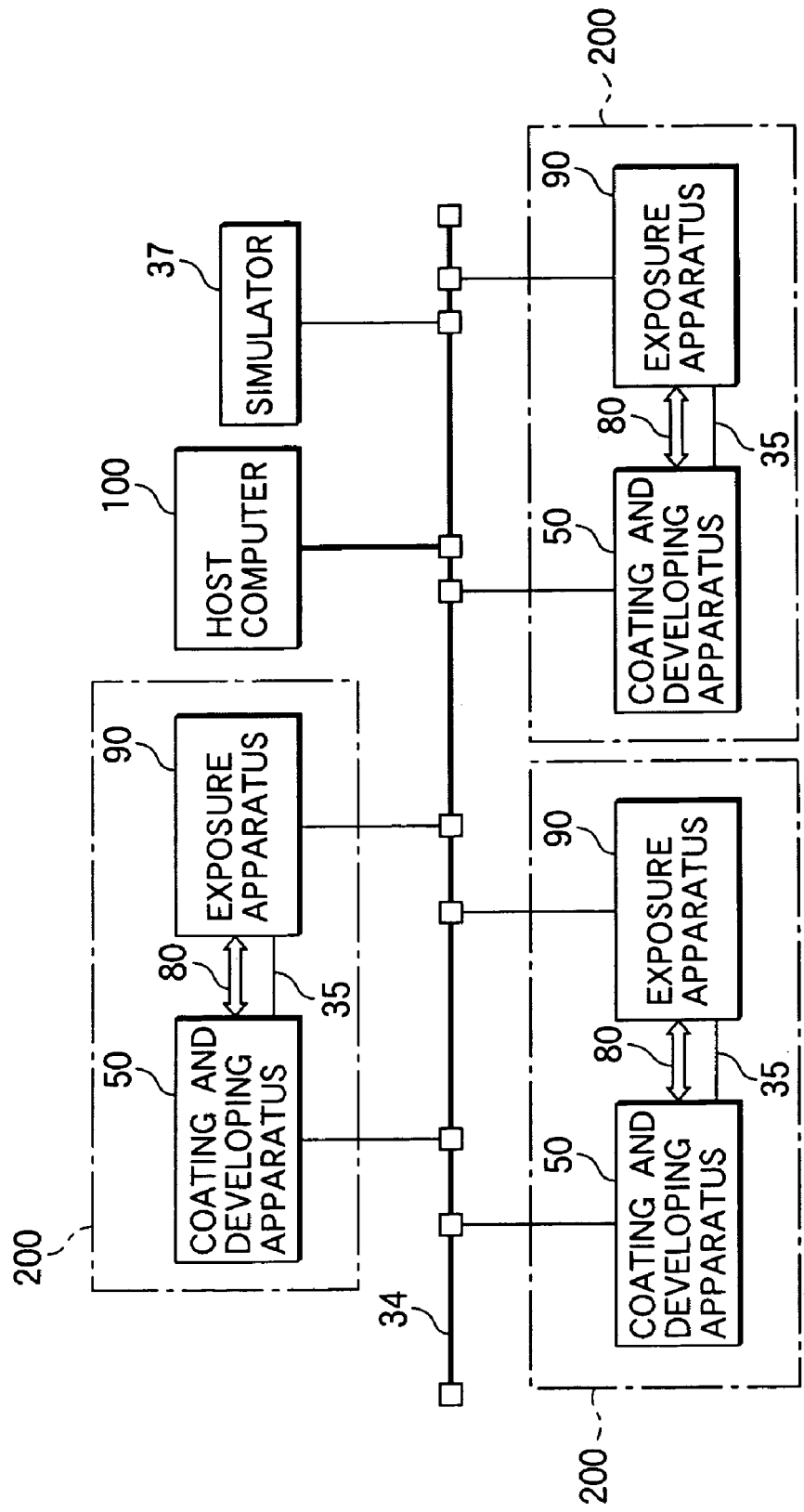
FIG. 10 is a block diagram illustrating the connection relationship among pattern forming apparatuses, a host computer and a simulator in a processing system which comprises a plurality of pattern forming apparatuses, the host computer, and the simulator, and to which a second embodiment is adapted.

FIG. 10 is a block diagram illustrating the connection relationship among pattern forming apparatuses, a host computer and a simulator in a processing system which comprises a plurality of pattern forming apparatuses (inline apparatuses), the host computer, and the simulator, and to which the embodiment is adapted. In FIG. 10, a simulator 37 as simulation means is added to the illustrated structure of the first embodiment.

The simulator 37 is connected to the LAN cables 34, and the operation is controlled by the host computer 100 via the communication path on the LAN. The simulator 37 has a function of simulating the operation of the inline apparatus comprising the coating and developing apparatus 50 and the exposure apparatus 90. Therefore, it is possible to acquire the time needed to process all the wafers W or the like by setting information on process recipes and parameters, such as the number of wafers to be processed, in the simulator 37.

Figure 11:
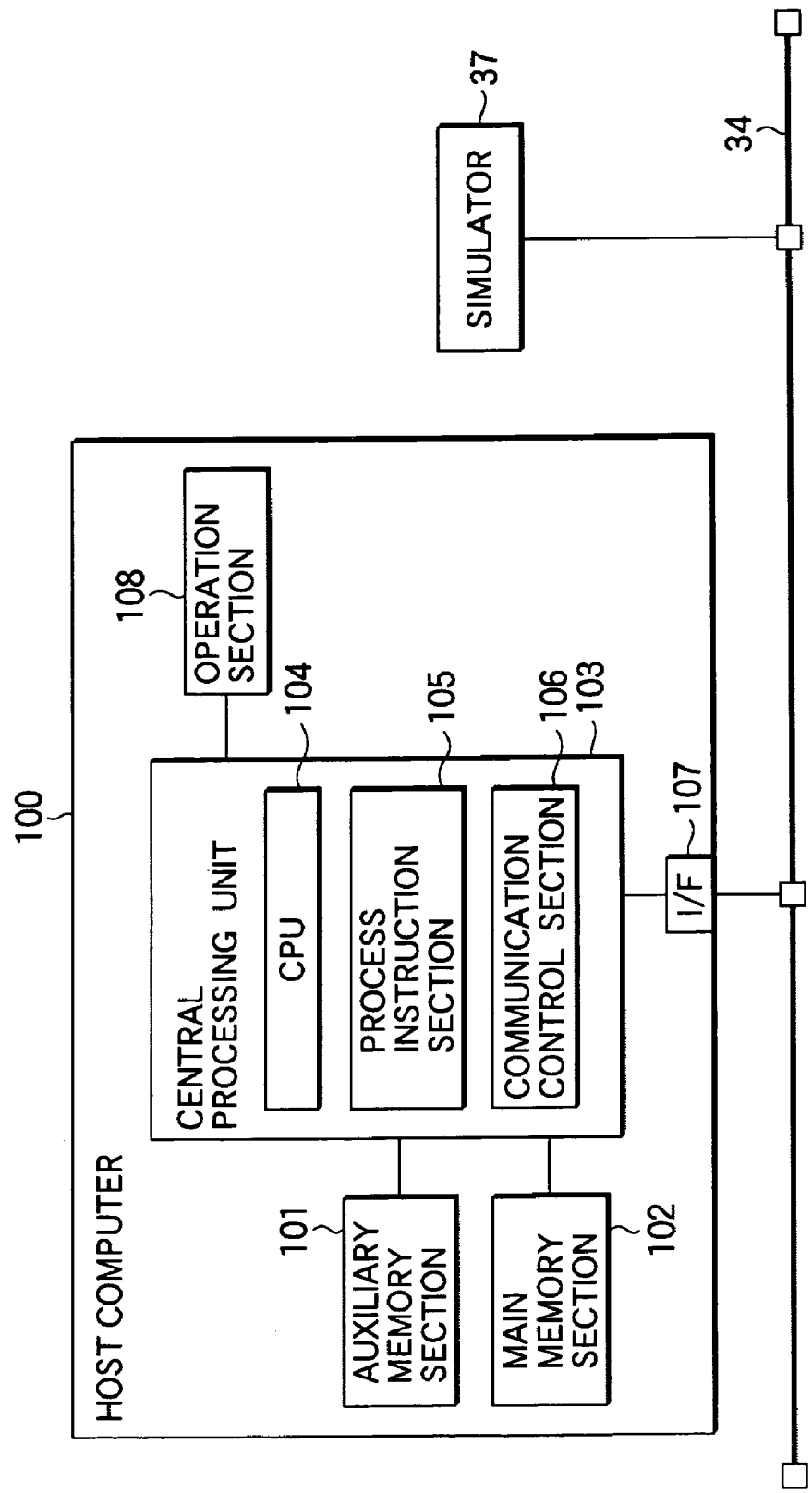
FIG. 11 is a block diagram showing the partial internal structure of the host computer.

FIG. 11 is a block diagram showing the partial internal structure of the host computer 100 which controls the simulator 37 and all the pattern forming apparatuses 200.

As shown in FIG. 11, the host computer 100 has, as hardware, a central processing unit 103 which performs the general internal control of the host computer 100 and is the main portion of the operational control.

Connected to the central processing unit 103 are an operation section 108 which is operated by an operator, a non-volatile auxiliary memory section 101, a main memory section 102 which temporarily reads and writes information, and a communication interface 107 for executing information communications.

The central processing unit 103 has a CPU 104, a process instruction section 105, and a communication control section 106.

The process instruction section 105 has a function of controlling inside the host computer 100 according to an instruction of the operator input from the operation section 108, and instructing the pattern forming apparatus 200 to do a process over the LAN.

The communication control section 106 has a function of performing communication control with respect to the pattern forming apparatus 200 and the simulator 37 via the communication interface 107.

Figure 12:
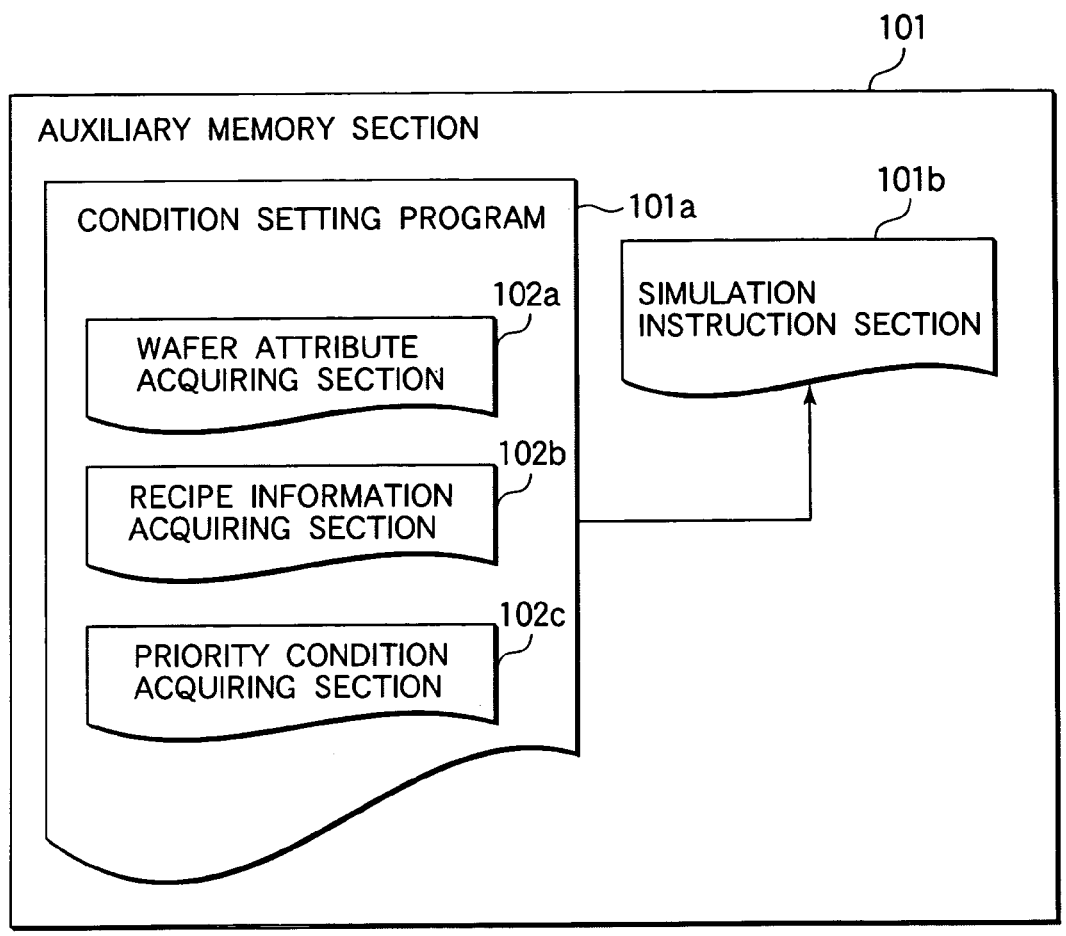
FIG. 12 is a diagram showing partial memory elements of an auxiliary memory section of the host computer.

FIG. 12 shows partial memory elements of the auxiliary memory section 101. At least a condition setting program 101*a* and a simulation instruction section 101*b* are stored and held in the non-volatile auxiliary memory section 101.

The condition setting program 101*a* comprises a wafer attribute acquiring section 102*a*, a recipe information acquiring section 102*b*, and a priority condition acquiring section 102*c*.

The wafer attribute acquiring section 102*a* has a function of acquiring wafer attribute information input through the operation section 108 by the operator. The wafer attribute information is process recipe information (the coating and developing recipe, exposure recipe) for all the wafers to be processed. One example of a data table 110 of the wafer attribute information is illustrated in FIG. 13. The wafer attribute acquiring section 102*a* is so constructed as to create the data table 110 from the acquired attribute information.

The recipe information acquiring section 102*b* has a function of acquiring process recipe information, such as required process time information, for the process recipes in the coating and developing apparatus 50 and the exposure apparatus 90 through communications with the respective apparatuses or the input from the operation section 108. One example of a data table 111 of the process recipe information is illustrated in FIG. 14. The recipe information acquiring section 102*b* is so constructed as to create the data table 111 from the acquired process recipe information.

The priority condition acquiring section 102*c* acquires a priority process condition for processing a wafer W from the input from the operation section 108. The priority process condition includes a condition to precede the process of the coating and developing apparatus 50, a condition to precede the process of the exposure apparatus 90, and a condition to precede the process of the overall pattern forming apparatus 200. When the operator selects the condition to precede the process of the coating and developing apparatus 50, for example, the processing order is determined in such a way that simulation by the simulator 37 involves few changes of process recipes in the coating and developing apparatus 50. One example of the priority process condition is illustrated in FIG. 15. The priority condition acquiring section 102*c* is so constructed as to create the data table 112 from the acquired priority process condition.

The simulation instruction section 101*b* has a function of sending a simulation execution command to the simulator 37 with the data tables as simulation conditions when all the data tables are created by execution of the condition setting program 101*a*.

Figure 16:
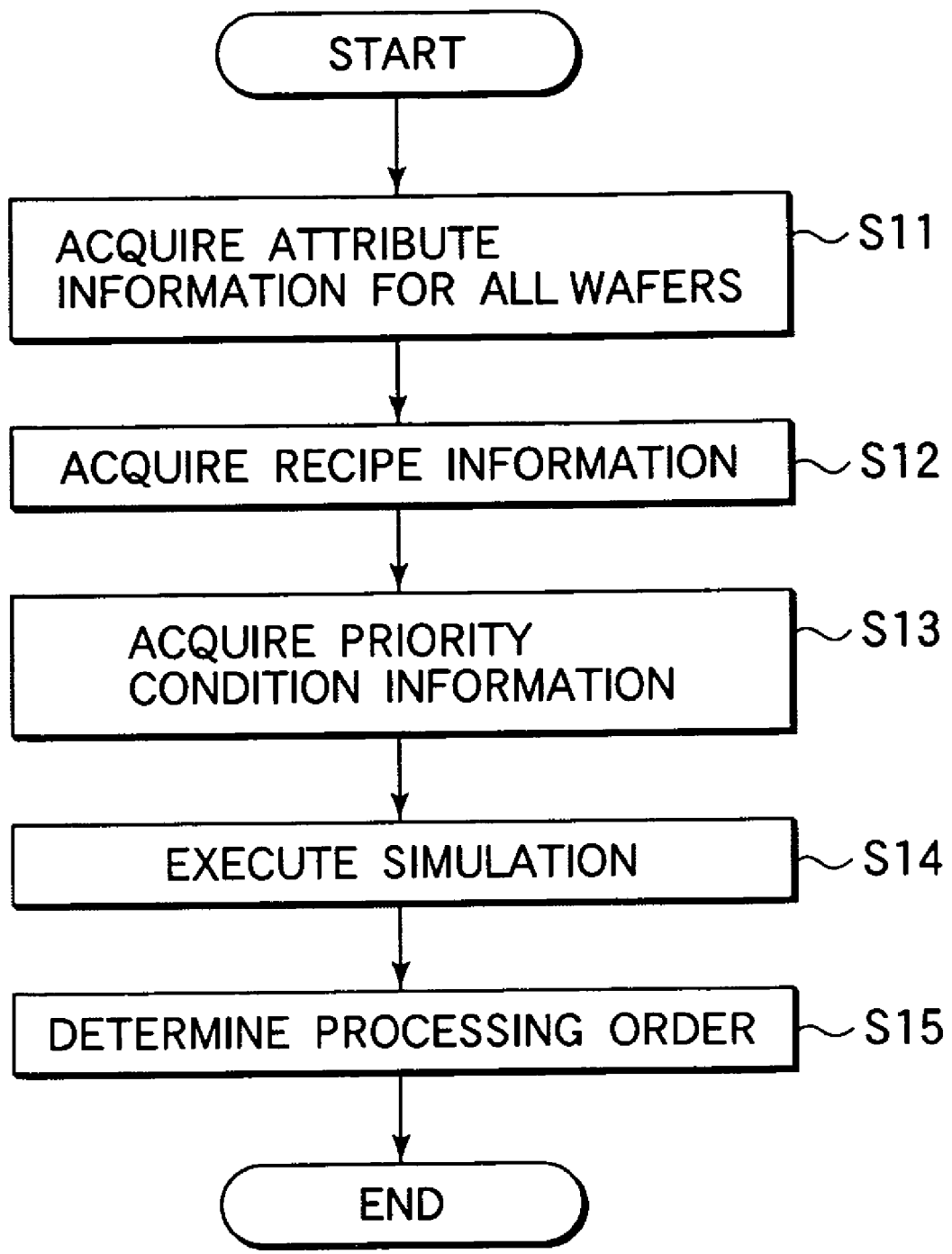
FIG. 16 is a diagram illustrating the execution flow of a condition setting program.

The execution of the condition setting program 101*a* will now be explained based on an execution flow shown in FIG. 16.

The condition setting program 101a is executed before wafers W to be processed are retained in the cassette CS.

When the condition setting program 101a is activated, the wafer attribute acquiring section 102a acquires attribute information relating to all the wafers W, input through the operation section 108 by the operator, and creates the data table 110 (step S11).

Next, the recipe information acquiring section 102b acquires process recipe information, such as required process time information, for the process recipes in the coating and developing apparatus 50 and the exposure apparatus 90 through communications with the respective apparatuses or the input from the operation section 108. Then, it creates the data table 111 from the acquired information (step S12).

The priority condition acquiring section 102c acquires a priority process condition for processing the wafers W from the input made through the operation section 108 by the operator. Then, it creates the data table 112 (step S13).

Note that the processing order of the steps S11 to S13 may be changed or they may be processed in parallel.

The condition setting program 101a creates the data tables 110, 111 and 112 this way.

When all the data tables are provided, the simulation instruction section 101b sends the simulation execution command to the simulator 37 with those data tables 110, 111 and 112 as simulation conditions.

The simulator 37 performs grouping of the same process recipe and the like referring to the data tables 110, 111 and 112, and executes plural kinds of simulation to compute the process time required to process all the wafers (step S14). This information is sent to the host computer 100, which determines the most efficient processing order to finish all the wafer processes in consideration of the priority condition and outputs it as a process schedule (step S15).

In accordance with the process schedule, the wafers W to be processed are retained in the individual cassettes CS and placed in the coating and developing apparatus 50 by the operator or the like.

The host computer 100 executes a process command with respect to the coating and developing apparatus 50 and the exposure apparatus 90 according to the process schedule.

According to the second embodiment, as described above, the host computer 100 acquires information on the process recipes of all the wafers before they are retained in the cassettes (the coating and developing recipe and exposure recipe), and can determine and control the order to ensure the most efficient processing of the wafers as the overall inline apparatus by executing simulation using the simulator 37.

As the operator or the like retains the wafers W in the cassette CS according to the process schedule output by the simulator 37, it is possible to prevent such a state where the wafers W with the same process recipe are alternately retained in the cassette CS. This can reduce the load of the control system in the coating and developing apparatus 50 and improve the process efficiency.

While the non-volatile auxiliary memory section 101 in the host computer 100 is a single non-volatile memory section in the second embodiment, it may be divided into plural sections. The method that includes steps executed by the condition setting program 101a and the simulation instruction section 101b, stored in the non-volatile auxiliary memory section 11, may be realized by hardware. Further, the inline apparatus is not limited to the coating and developing apparatus and the exposure apparatus, but the control method of the invention can be adapted to other apparatuses as long as they are inline apparatuses.

The present invention is not limited to the embodiments, but can be modified in various ways. For instance, the substrate is not limited to a semiconductor wafer, and the invention can be widely adapted to a transfer process for general substrates, such as a photomask substrate and a liquid crystal display substrate.

The above-described modes are merely intended to make the technical contents of the invention apparent, and the invention should not be interpreted as being restrictive to such specific examples, but may be embodied in various forms within the spirit of the invention and the scope of the appended claims.

INDUSTRIAL APPLICABILITY

As apparent from the above description, it is possible to provide a process schedule creating method which creates a schedule for efficiently processing all the objects to be processed in a single wafer processing manner in the overall inline apparatus that comprises a plurality of processing apparatuses.

The invention claimed is:

1. A process schedule creating method for creating a schedule at a time an inline apparatus, which has inline-connected first and second processing apparatuses and performs an inline process with those apparatuses, sequentially takes out objects to be processed from a plurality of containers retaining a plurality of objects to be processed, and performs single wafer processing on the objects, said method comprising the steps of:
   causing said first processing apparatus to acquire attribute information on each of all the objects retained in said plurality of containers, associated with a container retaining that object and a process condition;
   causing said first processing apparatus to acquire inside-container information associated with retained objects for each of said plurality of containers;
   causing said first processing apparatus to acquire information on a process condition in said second processing apparatus from said second processing apparatus; and
   causing said first processing apparatus to determine a processing order for said plurality of objects based on said attribute information, said inside-container information, process condition information of said first processing apparatus which said first processing apparatus has, and the process condition information of said second processing apparatus acquired from said second processing apparatus.

2. The process schedule creating method according to claim 1, wherein for each of the objects, said attribute information includes process-condition associated information associated with process conditions under which said processing apparatuses respectively perform processes, and container name information which specifies a container where each object is retained.

3. The process schedule creating method according to claim 1, wherein said inside-container information includes information on a number of objects in said container, and information on a number of process conditions under which the objects in said container are to be processed.

4. The process schedule creating method according to claim 1, wherein said process condition information includes information on a time required for a process with said process condition.

5. The process schedule creating method according to claim 1, wherein said step of causing said first processing apparatus to acquire the information on the process condition in said second processing apparatus from said second processing apparatus is carried out as said first processing apparatus directly communicates with the second processing apparatus inline-connected via a communication path formed in an LAN (Local Area Network).

6. The process schedule creating method according to claim 1, wherein the step of determining the processing order for each of the objects determines the processing order for the objects in such a way that a time from completion of processing of that objects in said second processing apparatus to beginning of processing in said first processing apparatus becomes constant.

7. A process schedule creating method for creating a schedule at a time an inline apparatus, which has inline-connected first and second processing apparatuses and performs an inline process with those apparatuses, sequentially takes out objects to be processed from a plurality of containers retaining a plurality of objects to be processed, and performs single wafer processing on the objects, said method comprising the steps of:
   causing control means for controlling a general operation of said inline apparatus to acquire attribute information on each of all the objects, associated with a process condition for that object before the objects are processed by said inline apparatus;
   causing said control means to acquire process condition information relating to a process condition under which the plurality of objects are processed, from each processing apparatus;
   causing said control means to acquire priority process condition when the objects are processed in each processing apparatus;
   executing simulation based on said attribute information, said process condition information, and said priority process condition; and
   determining a processing order for the plurality of objects based on a result of that simulation.

8. The process schedule creating method according to claim 7, wherein for each of the objects, said attribute information includes process-condition associated information associated with process conditions under which said processing apparatuses respectively perform processes.

9. The process schedule creating method according to claim 7, wherein said process condition information includes information on a time required for a process with said process condition.

10. The process schedule creating method according to claim 7, wherein said priority process condition is data on either a condition for preceding a process time in each processing apparatus or a condition for preceding a process time in the entire inline apparatus.

11. The process schedule creating method according to claim 7, wherein the step of determining the processing order for each of the objects determines the processing order for the objects in such a way that a time from completion of processing of that object in said second processing apparatus to beginning of processing in said first processing apparatus becomes constant.

12. A coating and developing apparatus which is inline-connected to an exposure apparatus, performs single wafer processing on a plurality of substrates sequentially taken out of a plurality of cassettes retaining the substrates, and comprises:
   a substrate attribute acquiring section which acquires attribute information on each of all the substrate retained in said plurality of cassettes, associated with a cassette retaining that substrate and a process condition;
   a cassette information acquiring section which acquires inside-cassette information associated with retained substrates for each of said plurality of cassettes;
   a recipe information acquiring section which acquires information on a process condition in said exposure apparatus from said exposure apparatus; and
   a processing order determining section which determines a processing order for the plurality of substrates based on said attribute information, said inside-cassette information, process condition information of the coating and developing apparatus which said coating and developing apparatus has, and the process condition information of said exposure apparatus acquired from said exposure apparatus.

13. The coating and developing apparatus according to claim 12, wherein for each of the substrates, said attribute information includes process-condition associated information associated with process conditions under which said coating and developing apparatus and said exposure apparatus respectively perform processes, and container name information which specifies a cassette where each substrate is retained.

14. The coating and developing apparatus according to claim 12, wherein said inside-cassette information includes information on a number of substrates in said cassette, and information on a number of process conditions under which the substrates in said cassette are to be processed.

15. The coating and developing apparatus according to claim 12, wherein said process condition information includes information on a time required for a process with said process condition.

16. The coating and developing apparatus according to claim 12, wherein said recipe information acquiring section acquires the information on the process condition in said exposure apparatus by directly communicating with the exposure apparatus inline-connected via a communication path formed in an LAN (Local Area Network).

17. The coating and developing apparatus according to claim 12, wherein said processing order determining section determines the processing order for each of the substrates in such a way that a time from completion of processing of that substrate in said exposure apparatus to beginning of processing in said coating and developing apparatus becomes constant.

18. A pattern forming apparatus which comprises a coating and developing apparatus and an exposure apparatus inline-connected to each other, and performs single wafer processing on a plurality of substrates sequentially taken out of a plurality of cassettes retaining the substrates, said coating and developing apparatus comprising:
   a substrate attribute acquiring section which acquires attribute information on each of all the substrates retained in said plurality of cassettes, associated with a cassette retaining that substrate and a process condition;
   a cassette information acquiring section which acquires inside-cassette information associated with retained substrates for each of said plurality of cassettes;
   a recipe information acquiring section which acquires information on a process condition in said exposure apparatus from said exposure apparatus; and
   a processing order determining section which determines a processing order for the plurality of substrates based on said attribute information, said inside-cassette information, process condition information of the coating and developing apparatus which said coating and developing apparatus has, and the process condition information of said exposure apparatus acquired from said exposure apparatus.

19. The pattern forming apparatus according to claim 18, wherein for each of the substrates, said attribute information includes process-condition associated information associated with individual process conditions in said coating and developing apparatus and said exposure apparatus, and container name information which specifies a cassette where each substrate is retained.

20. The pattern forming apparatus according to claim 18, wherein said inside-cassette information includes information on a number of substrates in said cassette, and information on a number of process conditions under which the substrates in said cassette are to be processed.

21. The pattern forming apparatus according to claim 18, wherein said process condition information includes information on a time required for a process with said process condition.

22. The pattern forming apparatus according to claim 18, wherein said recipe information acquiring section acquires the information on the process condition in said exposure apparatus by directly communicating with the exposure apparatus inline-connected via a communication path formed in an LAN (Local Area Network).

23. The pattern forming apparatus according to claim 18, wherein said processing order determining section determines the processing order for each of the substrates in such a way that a time from completion of processing of that substrates in said exposure apparatus to beginning of processing in said coating and developing apparatus becomes constant.

24. A processing system comprising:
a pattern forming apparatus which comprises a coating and developing apparatus and an exposure apparatus inline-connected to each other, and performs single wafer processing on a plurality of substrates sequentially taken out of a plurality of cassettes retaining the substrates;
control means which controls a general operation of said pattern forming apparatus, and includes,
a substrate attribute acquiring section which, for each of all the substrates, acquires attribute information associated with that substrate,
a recipe information acquiring section which acquires information on process conditions for the plurality of substrates from each of said coating and developing apparatus and said exposure apparatus, and
a priority condition acquiring section which acquires a priority process condition when the substrates are processed in each of said coating and developing apparatus and said exposure apparatus; and
means for executing simulation based on said attribute information, said process condition information, and said priority process condition in response to an instruction from said control means before the substrates are processed in said pattern forming apparatus,
whereby a processing order for said substrates is determined based on a result of that simulation.

25. The processing system according to claim 24, wherein for each of the substrates, said attribute information includes process-condition associated information associated with process conditions under which said coating and developing apparatus and said exposure apparatus respectively perform processes.

26. The processing system according to claim 24, wherein said process condition information includes information on a time required for a process with said process condition.

27. The processing system according to claim 24, wherein said priority process condition is data on either a condition for preceding a process time in each of said coating and developing apparatus and said exposure apparatus or a condition for preceding a process time in the entire pattern forming apparatus.

28. The processing system according to claim 24, wherein said processing order determining section determines the processing order for each of the substrates in such a way that a time from completion of processing of that substrate in said exposure apparatus to beginning of processing in said coating and developing apparatus becomes constant.

* * * * *